United States Patent
Laikhtman et al.

(10) Patent No.: US 7,176,498 B2
(45) Date of Patent: Feb. 13, 2007

(54) TERAHERTZ RADIATING DEVICE BASED ON SEMICONDUCTOR COUPLED QUANTUM WELLS

(75) Inventors: Boris Laikhtman, Jerusalem (IL); Leonid Shvartsman, Jerusalem (IL)

(73) Assignee: Yissum Research Development Company of the Hebrew University of Jerusalem, Jerusalem (IL)

( * ) Notice: Subject to any disclaimer, the term of this patent is extended or adjusted under 35 U.S.C. 154(b) by 0 days.

(21) Appl. No.: 10/743,268

(22) Filed: Dec. 23, 2003

(65) Prior Publication Data

US 2005/0029508 A1    Feb. 10, 2005

Related U.S. Application Data

(60) Provisional application No. 60/492,728, filed on Aug. 6, 2003.

(51) Int. Cl.
*H01L 27/15* (2006.01)

(52) U.S. Cl. ............... 257/86; 257/87; 257/94; 257/102; 257/103

(58) Field of Classification Search .......... 257/79–103
See application file for complete search history.

(56) References Cited

U.S. PATENT DOCUMENTS

| | | | |
|---|---|---|---|
| 4,348,686 A | 9/1982 | Esaki et al. | |
| 4,371,884 A | 2/1983 | Esaki et al. | |
| 4,558,336 A | 12/1985 | Chang et al. | |
| 4,745,452 A | 5/1988 | Sollner | |
| 4,806,993 A | 2/1989 | Voisin et al. | |
| 5,113,231 A | 5/1992 | Soderstrom et al. | |
| 5,185,647 A | 2/1993 | Vasquez | |
| 5,194,983 A | 3/1993 | Voisin | |
| 5,588,015 A | 12/1996 | Yang | |
| 5,710,430 A | 1/1998 | Nuss | |
| 5,894,125 A | 4/1999 | Brener et al. | |
| 6,037,604 A | 3/2000 | Su et al. | |
| 6,316,771 B1 | 11/2001 | Jurisson et al. | |
| 6,476,411 B1 * | 11/2002 | Ohno et al. | 257/15 |

(Continued)

FOREIGN PATENT DOCUMENTS

EP     0 433 542 A2    6/1991

(Continued)

*Primary Examiner*—Wai-Sing Louie
(74) *Attorney, Agent, or Firm*—Browdy and Neimark, PLLC

(57) ABSTRACT

A semiconductor device and method of its fabrication are provided to enable the device operation in a THz spectral range. The device comprises a heterostructure including at least first and second semiconductor layers. The first and second layers are made of materials providing a quantum mechanical coupling between an electron quantum well (EQW) in the first layer and a hole quantum well (HQW) in the second layer, and providing an overlap between the valence band of the material of the second layer and the conduction band of the material of the first layer. A layout of the layers is selected so as to provide a predetermined dispersion of energy subbands in the conduction band of the first layer and the valence band of the second layer. An application of an external bias field across the first and second layers causes THz radiation originating from radiative transitions of non-equilibrium carriers between at least one of the following: neighboring energy subbands of the EQW, neighboring energy subbands of the HQW, and ground energy subbands of the EQW and HQW.

37 Claims, 4 Drawing Sheets

U.S. PATENT DOCUMENTS

| | | | |
|---|---|---|---|
| 6,618,413 B2 * | 9/2003 | Bour et al. ............. | 372/45.01 |
| 6,635,907 B1 | 10/2003 | Nguyen et al. | |
| 2003/0127673 A1 | 7/2003 | Williamson et al. | |
| 2005/0029508 A1 | 2/2005 | Laikhtman et al. | |

FOREIGN PATENT DOCUMENTS

| | | |
|---|---|---|
| JP | 04-042983 A | 2/1992 |
| WO | WO 98/40916 A1 | 9/1998 |

* cited by examiner

TERAHERTZ RADIATING DEVICE BASED ON SEMICONDUCTOR COUPLED QUANTUM WELLS

The present application claims the benefit of U.S. Provisional 60/492,728, filed Aug. 6, 2003.

FIELD OF THE INVENTION

The present invention relates generally to terahertz radiating semiconductor devices, and more particularly to a quantum well oscillator operating in a terahertz region.

BACKGROUND OF THE INVENTION

A terahertz region of the spectrum of electromagnetic radiation (T-Rays or THz) is located between the most long wavelength "optical" part of the spectrum, i.e. the infra-red light, and the most short wavelength part of the "radio" spectrum, known as microwaves. The terahertz spectral region thus encompasses the frequencies in the range of about 0.1 through 20 THz or the wavelengths in the range of about 15 μm through 3 mm, although it should be appreciated that these limits are indicative rather than absolute.

The terahertz spectral range has an extreme importance owing to the variety of applications where it can be utilized. One important application of the terahertz spectral range is related to various imaging techniques (medical imaging, technological imaging, or security imaging), where there is a trend for a switch from the harmful and, sometimes, lethal X-rays to T-rays (see, for example, U.S. Pat. No. 5,710,430 to Nuss and U.S. Pat. No. 5,894,125 to Brener et al.)

Terahertz radiation can penetrate non-polar substances such as fats, cardboard, cloth and plastics with little attenuation. On the other hand, materials including organic substances have varying responses (transmission, reflection and absorption characteristics) to terahertz radiation. Likewise, water molecules absorb terahertz waves, on the one hand limiting penetration of the radiation in moist substances, and on the other hand making it readily detectable even in very low concentrations. Accordingly, use of terahertz radiation can indicate the presence of different materials in a medium.

T-rays are strongly attenuated by moist tissue, because of water absorption. However, having low average power, i.e. relatively low ionizing capability, T-rays are particularly attractive for medical applications where it is important to avoid damaging a biological sample.

Another important application of terahertz radiation is related to the communication technology. This can be the terahertz range that is the nearest and the most important barrier in the way to increase the bandwidth of wavelength-division-multiplexed communication networks.

Recent achievements in both fields mentioned above are rather remarkable, but still limited. The key reason for this limitation is a lack of reliable THz sources and detectors, especially when compared with the neighboring frequency ranges of microwaves and infrared radiation.

U.S. Pat. No. 6,476,411 to Ohno et al. describes a luminescent element that consists of indium-arsenide (InAs) and gallium-antimony (GaSb) semiconductor layers formed with specified band gap. The first layer makes a heterojunction with the second layer. The top of the valence band of the first semiconductor material is higher in energy than the bottom of the conduction band of the second semiconductor material. The element further includes a third layer making a heterojunction with the first or second layer. The third layer has a superlattice structure. One of the first and second layers is provided on the semiconductor substrate directly or through at least one semiconductor layer.

U.S. Pat. Application No. 2003/0127673 to Williamson et al. describes a semiconductor epitaxial structure optimized for photoconductive free space terahertz generation and detection. The epitaxial structure, termed as a photoconductive gate, includes a substrate composed of GaAs. A barrier layer is disposed between the substrate and photoconductive layer. A bipolar terahertz antenna comprised of a first pole and a second pole is disposed on the photoconductive layer. Sampling of a free space terahertz waveform occurs when the illuminated photoconductive gate conducts for a time shorter than the entire terahertz wave cycle. During the conduction period, charge flows from one side to another of a dipole antenna structure due to the potential difference induced by the terahertz wave. The amount of current flow per sampling optical pulse is proportional to the terahertz voltage potential and the off-state resistance of the interaction area.

SUMMARY OF THE INVENTION

There is a need in the art for, and it would be useful to have, a novel semiconductor device operable in THz spectral range and having improved gain characteristics.

The present invention provides a semiconductor device and method for generating radiation of a THz spectral range. The semiconductor device comprises a heterostructure that includes two or more semiconductor layers. The first and second semiconductor layers are made of materials providing a quantum mechanical coupling between an electron quantum well (EQW) in the first layer and a hole quantum well (HQW) in the second layer. The materials are such that an overlap is provided between the valence band of the material of the second layer and the conduction band of the material of the first layer. Preferably, the first layer material is InAs-based and the second layer material is GaSb-based.

The inventor has found that the device operation can be significantly improved by adjusting, in a controllable way, an effective overlap between the conduction and valence bands of the first and second layers' materials, respectively, such that an energy gap between these bands lies in a THz spectral range. The "effective overlap" is defined by the dispersion of energy subbands in the conduction band of the first layer and the valence band of the second layer. For given materials of the first and second semiconductor layers that define a certain overlap between the conduction and valence bands therein (e.g., 150 meV for the first and second layers made of pure InAs and GaSb), the desired effective overlap may be reduced in a controllable way or cancelled completely by appropriately varying the heterostructure parameter(s).

Thus, the main idea of the present invention consists of selecting a layout of the layers of the heterostructure so as to provide a predetermined dispersion of energy subbands in the conduction band of the first layer and the valence band of the second layer. An application of an external bias field across the first and second layers causes THz radiation originating from radiative transitions of non-equilibrium carriers between at least one of the following: neighboring energy subbands of the EQW, neighboring energy subbands of the HQW, and ground energy subbands of the EQW and HQW.

The term "layout of the layers" used herein signifies the layers' arrangement (e.g., the optional use of a barrier layer between the first and second semiconductor layers and/or cladding layers enclosing the first and second layers therebetween) and the layers' parameters (geometry and materials).

The first and second layers may be directly coupled to each other, or may be coupled via a barrier layer. The heterostructure may comprise first and second cladding layers enclosing therebetween the first and second layers (with or without a barrier layer between them). For example for the InAs-based and GaSb-based first and second layers, the first and second cladding layers are preferably selected from AlInAs-based and AlSb-based materials, respectively. The barrier layer may be based on AlSb.

The device further includes an electrode arrangement configured for the application of the external bias field, e.g., electric voltage.

The device of the present invention may be configured as a resonator cavity. In such a case, the heterostructure operates as an active medium of the cavity.

As indicated above, the predetermined dispersion of the energy subbands in the quantum wells defines the effective overlap between the conduction and valence bands of the first and second layers' materials, respectively. This dispersion may be such that energy of the ground hole subband of the HQW without any coupling is either higher or lower than the energy of the ground electron subband of the EQW without any coupling.

The predetermined dispersion of the energy subbands can be controlled by altering the thickness and/or chemical compound of at least one of the layers (i.e., at least one of the first and second layers, and/or the barrier layer, and/or the cladding layers), and/or the width and predetermined potential profile of at least one of the quantum wells. The material composition of at least one of the first and second layers may be spatially inhomogeneous in a direction normal to the respective layer. In such a case, the predetermined potential profile of the respective quantum well can be provided.

The THz radiation provided by the semiconductor device of the invention can be enhanced by a resonance condition of the radiative transitions between the energy subbands. These radiative transitions include transitions between the neighboring subbands within the EQW and/or the neighboring subbands within the HQW. Moreover, the resonance condition can be further enhanced by the radiative transitions between the ground subband of the EQW and the ground subband of the HQW.

The predetermined dispersion of the subbands may be such that a plurality of the neighboring energy subbands in at least one of the EQW and HQW are substantially equidistant, thereby causing the resonance condition of the radiative transitions between the neighboring energy subbands of the respective quantum well. Preferably, the neighboring energy subbands of the EQW and HQW are all substantially equidistant within each quantum well, and a distance between the ground energy subbands of the EQW and HQW is equal to the distance between the neighboring energy subbands of the EQW and HQW.

The predetermined particular potential profile of at least one of the EQW and HQW may be substantially semiparabolic. This provides substantial equidistance in between a plurality of the neighboring energy subbands in the respective quantum well for causing a resonance condition of the radiative transitions between the subbands.

The predetermined potential profile of at least one of the EQW and HQW may be substantially step-like, while a few of the neighboring energy subbands in the respective quantum well are substantially equidistant for causing a resonance condition of the radiative transitions between the subbands.

The semiconductor device of the present invention operable in a THz range has many of the advantages of the techniques mentioned theretofore, while simultaneously overcoming some of the disadvantages normally associated therewith.

For example, the semiconductor device according to the present invention can demonstrate the improved temperature characteristics owing to the parallelism of the equidistant subbands in the EQW. Such parallelism results in the fact that temperature broadening of the carrier energy distribution of each subband substantially does not influence on the gain.

Furthermore, the semiconductor device according to the present invention can demonstrate improved radiative characteristics, because the Auger recombination is suppressed owing to the rather effective nearly static screening of the Coulomb interaction contrary to the much less effective dynamic screening in the infrared and optical wavelength range. Likewise, the radiative characteristics can be improved because the optical phonon scattering can be suppressed when the radiated frequency is lower than the typical radiated frequency of optical phonons.

Moreover, the semiconductor device according to the present invention is of a durable and reliable construction, may be easily and efficiently manufactured and marketed, and may have low manufacturing cost.

Thus, in accordance with one broad aspect of the invention, there is provided a semiconductor device operable in a THz spectral range, the device comprising a heterostructure including at least first and second semiconductor layers, the first and second layers being made of materials providing a quantum mechanical coupling between an electron quantum well (EQW) in the first layer and a hole quantum well (HQW) in the second layer, and providing an overlap between the valence band of the material of the second layer and the conduction band of the material of the first layer, a layout of the layers being selected so as to provide a predetermined dispersion of energy subbands in the conduction band of the first layer and the valence band of the second layer to define a desired effective overlap between the energy subbands of said conduction and valence bands, whereby an application of an external bias field across the first and second layers causes THz radiation originating from radiative transitions of non-equilibrium carriers between at least one of the following: neighboring energy subbands of the EQW, neighboring energy subbands of the HQW, and ground energy subbands of the EQW and HQW.

According to another broad aspect of the present invention there is provided a method of fabricating a semiconductor device operable in a THz spectral range, the method comprising forming a heterostructure from selected layers, wherein the layers include at least first and second semiconductor layers made of materials providing a quantum mechanical coupling between an electron quantum well (EQW) in the first layer and a hole quantum well (HQW) in the second layer and providing an overlap between the valence band of the material of the second layer and the conduction band of the material of the first layer, a layout of the layers and the potential profile of the quantum wells are selected so as to provide a predetermined dispersion of energy subbands in the conduction band of the first layer and the valence band of the second layer to define a desired effective overlap between the energy subbands of said conduction and valence bands, thereby enabling generation of THz radiation originating from radiative transitions of non-equilibrium carriers between at least one of the following: neighboring energy subbands of the EQW, neighboring energy subbands of the HQW, and ground energy subbands of the EQW and HQW.

In case when at least several of the above-mentioned radiative transitions have substantially the same frequency, they are resonantly enhanced and favor the higher gain.

There has thus been outlined, rather broadly, the more important features of the invention so that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF SPECIFIC EMBODIMENTS

Figure 1A:
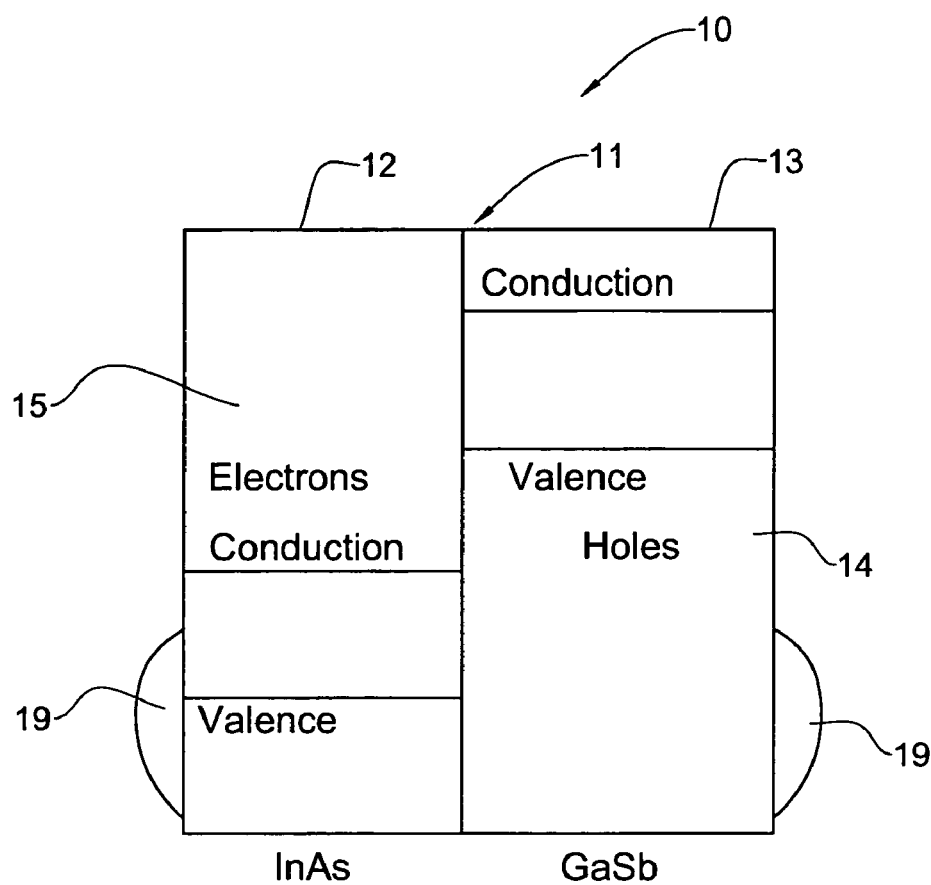
FIGS. 1A–1D illustrate enlarged cross-sectional views of semiconductor devices, according to several examples of the present invention.

The principles and operation of a device according to the present invention may be better understood with reference to the drawings and the accompanying description, it being understood that these drawings and examples in the description are given for illustrative purposes only and are not meant to be limiting. Dimensions of layers and regions may be exaggerated for clarity. The same reference numerals will be utilized for identifying those components which are common in all the examples of the invention.

Referring to FIG. 1A, there is illustrated a schematic cross-sectional view of an exemplary semiconductor device 10 operable in terahertz (THz) spectral range, according to the present invention. It should be noted that this figure is not to scale, and is not in proportion, for purposes of clarity. The device 10 may for example be a source (emitter) of THz radiation.

The semiconductor device 10 comprises a heterostructure 11 including a first semiconductor layer 12 and a second semiconductor layer 13. The first and second semiconductor layers are made of materials providing a quantum mechanical coupling between an electron quantum well (EQW) in the first layer 12 and a hole quantum well (HQW) in the second layer 13. The materials of the first and second layers are selected so as to provide an overlap between the valence band 14 of the second layer 13 and the conduction band 15 of the first layer 12. Preferably, the material of the first layer is InAs-based and the material of the second layer is GaSb-based. For instance, when the first and second layers are made of pure InAs and GaSb, respectively, the overlap between the valence band 14 of the second layer 13 and the conduction band 15 of the first layer 12 is about 150 meV As shown in the example of FIG. 1A, the first semiconductor layer 12 and the second semiconductor layer 13 are abutting one another. Thus, the direct quantum-mechanical coupling is provided, and in other words, the layers 12 and 13 are directly coupled to each other.

Figure 1B:
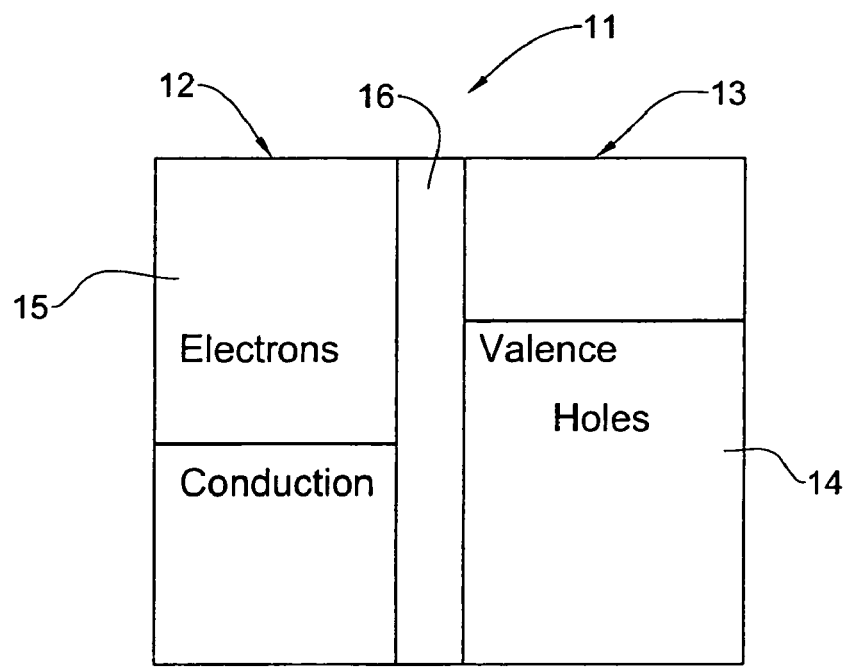
Figure 1C:
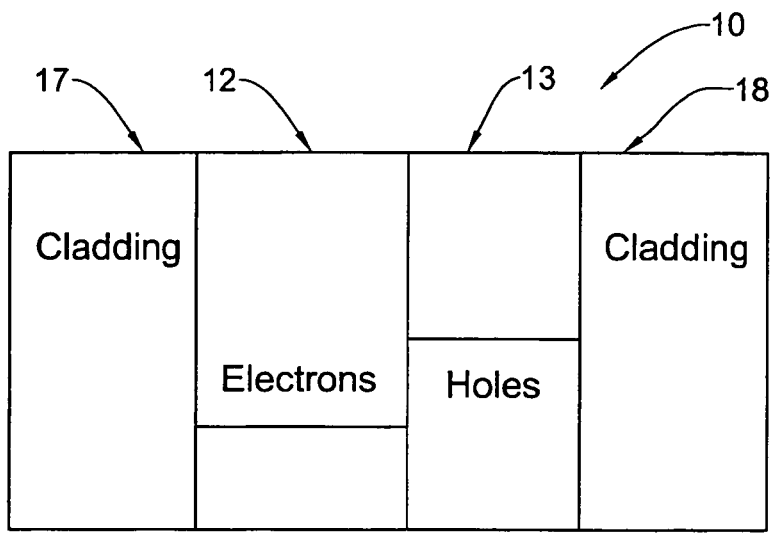
Figure 1D:
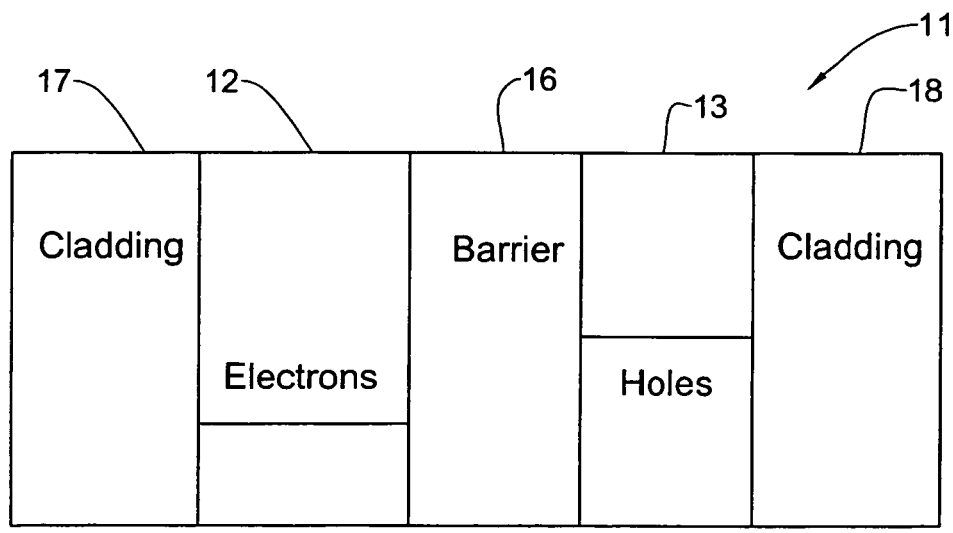

FIG. 1B–1D show three more examples, respectively, of the implementation of the device of the present invention. In the example of FIG. 1B, the first and second layers 12 and 13 are coupled to each other via a barrier layer 16. In the example of FIG. 1C the heterostructure 11 further comprises first and second cladding layers 17 and 18 enclosing the first and second layers 12 and 13 therebetween. As shown in FIG. 1D, the heterostructure 11 includes the barrier layer 16 between the first and second layers 12 and 13, and the first and second cladding layers 17 and 18 enclosing therebetween the first and second layers 12 and 13 with the barrier layer 16 between them.

The layers' layout in the heterostructure is selected so as to provide a predetermined dispersion of energy subbands in the conduction band of the first layer 12 and the valence band of the second layer 13. As indicated above, the term "layer's layout" used herein signifies the layers' arrangement (e.g., the use of a barrier layer and/or cladding layers) and their parameters (geometry and materials). The application of an external bias field across the first and second layers (via an electrodes' arrangement 19 shown in FIG. 1A) injecting electrons and holes in the first and second layers, respectively, causes THz radiation originating from radiative transitions of non-equilibrium carriers between at least one of the following: neighboring energy subbands of the EQW, neighboring energy subbands of the HQW, and ground energy subbands of the EQW and HQW.

The layers' layout includes that of the first and second semiconductor layers 12 and 13, and possibly also the first and second cladding layers 17 and 18 and/or the barrier layer 16. The predetermined dispersion of the energy subbands provides an energy gap between the ground energy subbands in the EQW and HQW layers, which gap lies in the THz spectral range. The predetermined dispersion of the energy subbands may be such that the energy of the ground hole subband of the HQW without any coupling is higher than the energy of the ground electron subband of the EQW without any coupling. According to another embodiment of the invention, the predetermined dispersion of the energy subbands is such that the energy of the ground hole subband of the HQW without any coupling is lower than the energy of the ground electron subband of the EQW without any coupling.

Thus, the predetermined dispersion of the energy subbands can be controlled by altering various parameters of the heterostructure. For example, this can be achieved by altering thickness of at least one of the first and second layers 12 and 13. The widths of each of the first and second layers may be in a range of 1–500 nm. According to a further example, the predetermined dispersion of the energy subbands can be controlled by appropriately selecting a chemical compound of the material of at least one of the layers.

It should be appreciated that when the first and second layers 12 and 13 are coupled to each other via the barrier layer 16 (as exemplified in FIG. 1B), the parameters controlling the dispersion of the energy subbands may include the thickness and chemical compound of the material of the barrier layer. For example, the barrier layer can have a thickness in the range of 0.6–6 nm. A specific but not limited example of the barrier layer material is AlSb.

Likewise, when the semiconductor device of the invention comprises the first and second cladding layers 17 and 18 enclosing the first and second layers 12 and 13 (as exemplified in FIG. 1C), the parameters controlling the dispersion of the energy subbands may include the thickness and chemical compound of the material of the cladding layers. For example, the thickness of the first and second cladding layers 17 and 18 can be in the range of 0.1–100 nm. In turn, the cladding layers 17 and 18 can, for example, be selected from $Al_xIn_{(1-x)}As$-based and AlSb-based materials, respectively.

Alternatively or additionally, the predetermined dispersion of the energy subbands can be achieved by appropriately selecting the width and predetermined potential profile of at least one of the quantum wells. The predetermined potential profile of the quantum well can be controlled by altering a material composition of the respective one of the first and second layers, thereby providing a quantum well which is spatially inhomogeneous in a direction normal to the respective layer.

Figure 2:
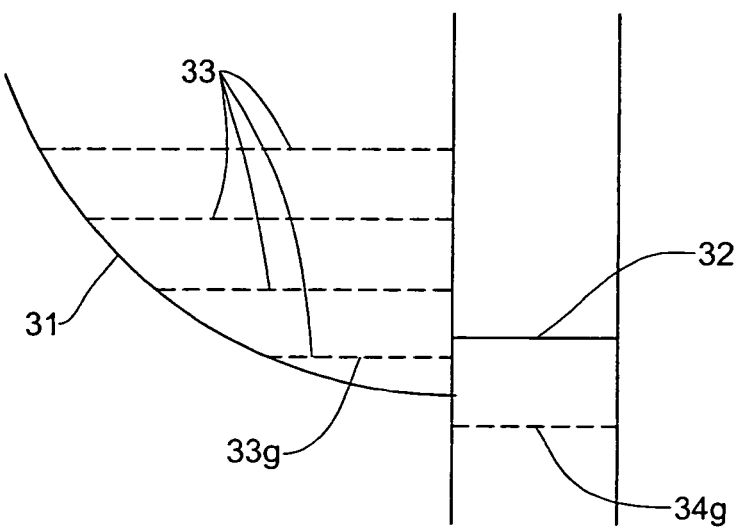
FIG. 2 exemplifies the spatially inhomogeneous potential profile suitable to be used in the heterostructure of FIG. 1A.

Referring to FIG. 2, an example of the spatially inhomogeneous potential profile is illustrated for the heterostructure shown in FIG. 1A. According to this example, the potential profile 31 of the EQW corresponding to the first layer (12 in FIG. 1A) is substantially semi-parabolic, while the potential profile 32 of the HQW corresponding to the second layer (13 in FIG. 1A) is substantially step-like.

For example, in the case when the first and the second layers are fabricated from $X_sInAs_{1-s}$ and GaSb, respectively, the parameters of the first and second layers providing the quantum well profiles are as follows: the thickness of each of the first and the second layers is of about 1–500 nm; and the spatially inhomogeneity can be described by the approximation function $s=(x/x(0))^2$, where $x(0)$ can be in the region of 50–1000 nm, x is the concentration of component X, which may, for example, be one of the following: $X=GaAs_{\{0.09\}}Sb_{-\{0.91\}}$; $X=InSb_{\{0.31\}}P_{\{0.69\}}$; X=AlSb.

The profile of the quantum wells EQW and HQW shown in FIG. 2 can result in the fact that a plurality of neighboring energy subbands 33 in the quantum well of the first layer 12 is substantially equidistant, thereby causing a resonance condition of the radiative transitions of non-equilibrium carriers between the neighboring energy subbands of the EQW.

Likewise, by controlling the above-described parameters of the second layer 13, the condition can be achieved when the distance between a ground subband 33g of the EQW and a ground subband 34g of the HQW is equal to the distance between the neighboring energy subbands 33 of the EQW.

The THz radiation obtainable by the technique of the present invention can thus be enhanced by creating a resonance condition of the radiative transitions between neighboring energy subbands within either one or both quantum wells EQW and HQW, and can be even more enhanced by the radiative transitions between the ground subband of the EQW and the ground subband of the HQW.

It should be appreciated that the situation can be also vice versa to that shown in FIG. 2, i.e. the quantum well corresponding to the second layer 13 can be substantially semi-parabolic, while the quantum well corresponding to the first layer 12 can be substantially step-like. Likewise, the quantum wells corresponding to the first and second layers can, inter alia, be both step-like or semi-parabolic.

Figure 3:
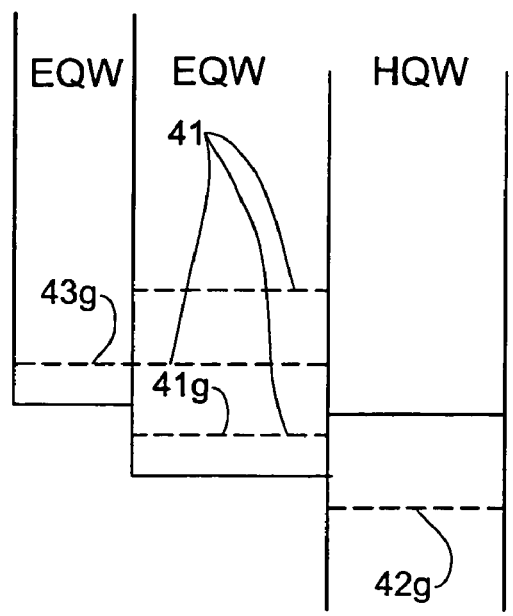
FIG. 3 illustrates an example of the potential profile suitable to be used in the heterostructure shown in FIG. 1C.

Referring to FIG. 3, an example of the potential profile of the heterostructure shown in FIG. 1C is illustrated. According to this example, the potential profiles of the EQW and HQW of the first and second layers 12 and 13, as well as an electron quantum well of the first cladding layer 17, are all substantially step-like. The parameters of the layers are selected so that a plurality of the neighboring energy subbands 41 in the EQW is substantially equidistant, thereby causing a resonance condition of the radiative transitions between the subbands. Moreover, the distance between the ground subband 41g of the EQW of the first layer 12 and the ground subband 42g of the HQW of the second layer 13 is equal to the distance between the ground subband 41g of the EQW and ground subband 43g of the EQW of the first cladding layer that, in turn, has the same energy as the ground subband 41g. According to this example, radiative transitions of non-equilibrium carriers can occur between: (i) the neighboring energy subbands 41 in the EQW; (ii) the ground subbands 41g and 43g; and (iii) the ground subbands 41g and 42g.

Figure 4:
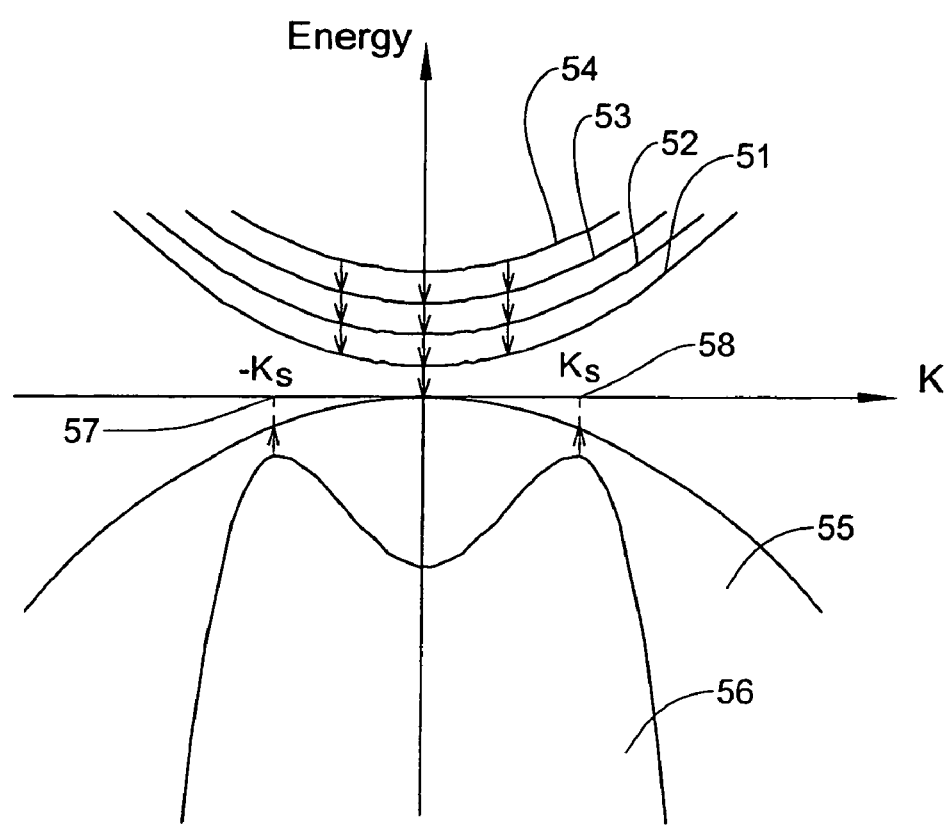
FIGS. 4 and 5 illustrate two examples, respectively, of a Wave vector-Energy plot for the subband dispersion of the heterostructure of the invention.

Referring to FIG. 4, an example of a Wave vector-Energy plot for the subband dispersion is illustrated for the heterostructure of the invention. According to this example, the parameters of the heterostructure are selected such that the ground subbands of the quantum wells in first and second layers 12 and 13 do not overlap (i.e., "negative" overlap).

On the one hand, subbands 51–54 corresponding to the EQW are all substantially parabolic and parallel in the Wave vector-Energy plot (k-E). On the other hand, a ground subband 55 corresponding to the HQW is an upside-down parabola, and a further subband 56 corresponding to the HQW has an upside-down W-like shape.

It should be appreciated that in the heterostructure having the subband dispersion as shown in FIG. 4 the following radiative transitions can occur.

A first type of transition can be achieved between the parallel subbands 51–54 within the entire range of variation of the wave-vector k. The inventor has found that for N parallel subbands, the gain provided by the resonance condition owing to the transition between the neighboring subbands can be approximately N times higher that in a conventional radiative system based on one radiative transition.

A second type of transition can be achieved between the ground subband 51 of the EQW and the ground subband 55 corresponding to the HQW when the wave-vector equals zero (i.e., k=0).

A third type of transition can be achieved between the ground subband 55 and the subband 56 both corresponding to the HQW. This transition can occur at a certain magnitude $k_s$ of the wave-vector indicated by reference numerals 57 and 58. As can be seen in FIG. 4, when the wave-vector equals $k_s$ the energy corresponding to the subband 56 is in the vicinity of its maximum value, thereby minimizing the energy gap between the ground subband 55 and the subband 56.

It should be appreciated that that the maximum gain can be obtained when all the three types of transition occur simultaneously.

Figure 5:
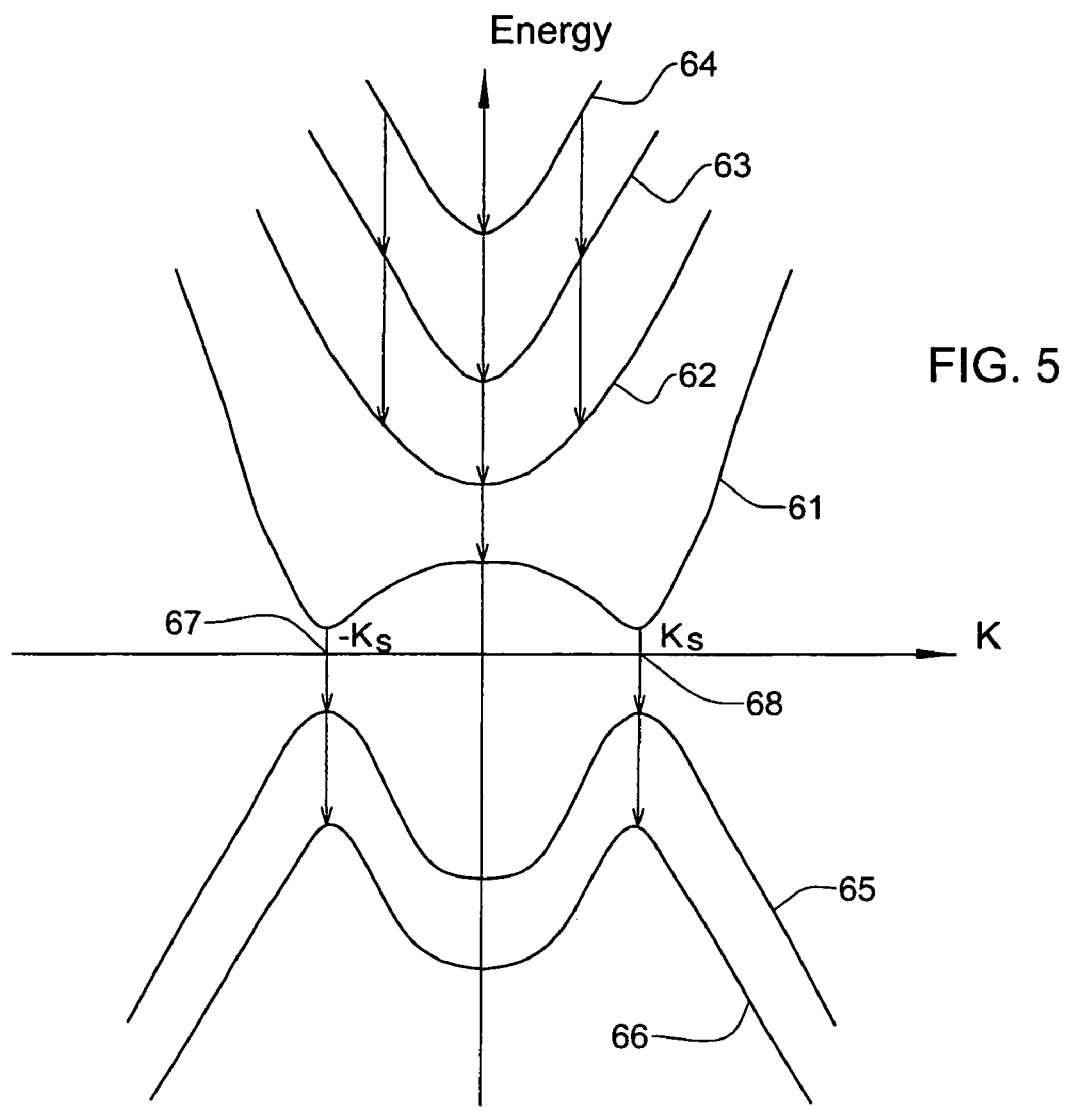

Referring to FIG. 5, another example of a Wave vector-Energy plot for the subband dispersion is illustrated for the heterostructure of the invention. According to this example, the parameters of the heterostructure are selected such that the ground subbands of the quantum wells in first and second layers substantially overlap (i.e., "positive" overlap). Here, a ground subband 61 of the EQW has a W-like shape in the Wave vector-Energy plot (k-E), while the other subbands 62–64 corresponding to the EQW are all substantially parabolic and parallel. In turn, a ground subband 65 and a further subband 66 corresponding to the HQW are substantially parallel and have an upside-down W-like shape.

In the heterostructure having the subband dispersion as shown in FIG. 5 the following radiative transitions can occur.

A first type of transition can be achieved between the parallel subbands 62–64 within the entire range of variation of the wave-vector k. Similar to the example of FIG. 4, for N parallel subbands, the gain provided by the resonance condition owing to the transition between the neighboring subbands can be approximately N times higher that in a conventional radiative system based on one radiative transition.

A second type of transition can be achieved between the ground subband 61 and subband 62 of the EQW when the wave-vector equals zero (i.e., k=0).

A third type of transition can be achieved between the ground subband 61 of the EQW and the ground subband 65 corresponding to the HQW. This transition can occur at the certain magnitude $k_s$ of the in plane wave-vector indicated by reference numerals 67 and 68. As can be seen in FIG. 5, when the wave-vector equals $k_s$ the energy gap between the ground subband 65 and the subband 66 is minimal.

A fourth type of transition can be achieved between the ground subband 65 and the subband 66 both corresponding to the HQW. This transition can occur at the certain magnitude $k_s$ of the in plane wave-vector.

It should be appreciated that that the maximum gain can be obtained when all the four types of transition occur simultaneously.

Figure 6:
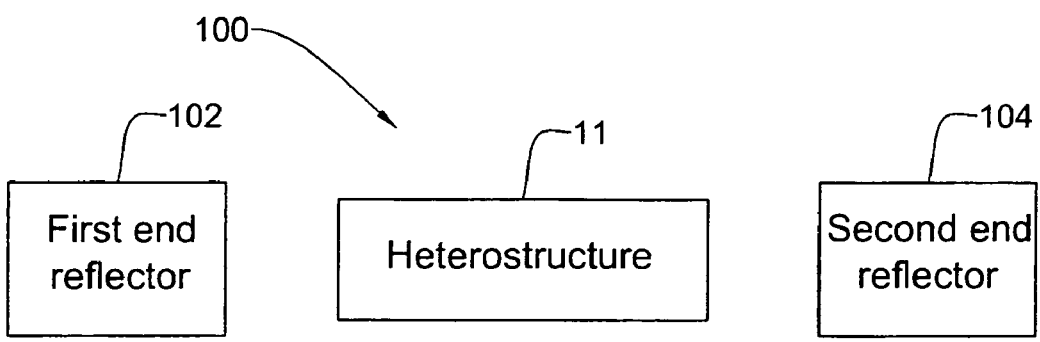
FIG. 6 exemplifies a semiconductor device of the invention configured as a resonator cavity (laser).

Reference is now made to FIG. 6, illustrating a resonator cavity (laser) 100 utilizing the device 10 of the present invention (constructed according to either one of the above examples). The device 10 is typically accommodated between end reflectors 102 and 104. The heterostructure 11 operates as an active medium of the resonator cavity.

As such, those skilled in the art to which the present invention pertains, can appreciate that while the present invention has been described in terms of preferred embodiments, the concept upon which this disclosure is based may readily be utilized as a basis for the designing other structures, systems and processes for carrying out the several purposes of the present invention.

Also, it is to be understood that the phraseology and terminology employed herein are for the purpose of description and should not be regarded as limiting.

Finally, it should be noted that the term "comprising" as used throughout the appended claims is to be interpreted to mean "including but not limited to".

It is important, therefore, that the scope of the invention is not construed as being limited by the illustrative embodiments set forth herein. Other variations are possible within the scope of the present invention as defined in the appended claims and their equivalents.

The invention claimed is:

1. A semiconductor device operable in a THz spectral range, the device comprising a heterostructure configured to generate THz spectral range radiation in response to an external field applied across it, the heterostructure comprising at least first and second semiconductor layers made of materials providing a certain initial overlap between the valence band of the second layer material and the conduction band of the first layer material, and having a selected layout of the heterostructure layers providing a quantum mechanical coupling between an electron quantum well (EQW) in said first layer and a hole quantum well (HQW) in said second layer, said selected layout of the layers of the heterostructure defining a predetermined arrangement of a plurality of energy subbands and a predetermined dispersion of these subbands including the substantially equidistant neighboring subbands to define a desired effective overlap between the energy subbands of said conduction and valence bands, thereby creating a condition of the multiple resonant radiative transitions substantially of the same frequency of the THz spectral range between the equidistant neighboring subbands, whereby an application of an external bias field across the first and second layers causes the THz spectral range radiation originating from said radiative transitions of non-equilibrium carriers between at least one of the following: neighboring energy subbands of the EQW, neighboring energy subbands of the HQW, and ground energy electron subband of the EQW and ground energy hole subband of the HQW.

2. The device of claim 1, wherein the first layer material is InAs-based and the second layer material is GaSb-based.

3. The device of claim 2, wherein the thickness of each of the first and second layers is in a range of about 1–500 nm.

4. The device of claim 1, wherein the first and second layers are directly coupled to each other with no additional layer between them.

5. The device of claim 1, wherein the heterostructure comprises a barrier layer between the first and second layers.

6. The device of claim 5, wherein the barrier layer is based on AlSb.

7. The device of claim 5, wherein the barrier layer has a thickness in a range of about 0.6–6 nm.

8. The device of claim 1, wherein the heterostructure comprises first and second cladding layers enclosing the first and second layers therebetween, respectively.

9. The device of claim 8, wherein the first and second cladding layers are selected from AlInAs-based and AlSb-based materials, respectively.

10. The device of claim 5, wherein the heterostructure comprises first and second cladding layers enclosing therebetween the first and second layers with the barrier layer between the first and second layers.

11. The device of claim 1, comprising an electrode arrangement configured to provide electrical contacts to the first and second layers and thus enable the application of said external bias field.

12. The device of claim 1, comprising reflectors at opposite sides of the heterostructure, the device being thus configured and operable as a resonator cavity, said heterostructure serving as an active medium of the cavity.

13. The device of claim 1, wherein said selected layout of the layers of the heterostructure defines the predetermined dispersion of the energy subbands characterized by a predetermined energy gap of the THz spectral range between the ground energy subband of the EQW and the ground energy subband of the HQW.

14. The device of claim 13, wherein said predetermined dispersion of the energy subbands includes W-like dispersion of both the ground hole subband of the HQW and of the ground electron subband of the EQW.

15. The device of claim 13, wherein said predetermined dispersion of the energy subbands includes parabolic-like dispersion of the ground hole subband of the HQW and of the ground electron subband of the EQW.

16. The device of claim 13, wherein said predetermined dispersion of the energy subbands is defined by at least one of the following parameters of the layout: thickness of at least one of the layers, chemical compound of the material of at least one of the layers, width and predetermined potential profile of at least one of the quantum wells.

17. The device of claim 16, wherein the heterostructure comprises a barrier layer between the first and second layers, the thickness and chemical compound of the material of said barrier layer being selected to provide the substantially equidistant neighboring energy subbands.

18. The device of claim 16, wherein the heterostructure comprises first and second cladding layers enclosing said first and second layers therebetween, respectively, the thickness and chemical compound of the material of the cladding layers being selected to provide the substantially equidistant neighboring energy subbands.

19. The device of claim 16, wherein a material composition of at least one of the first and second layers is spatially inhomogeneous in a direction normal to the respective layer, thereby providing a predetermined inhomogeneous potential profile of the respective quantum well.

20. The device of claim 1, wherein said multiple THz radiative transitions include the transitions between the different neighboring subbands within the EQW, the different neighboring subbands within the HQW, and the ground electron subband of the EQW and ground hole subband of the HQW.

21. The device of claim 1, wherein said multiple THz radiative transitions include the transitions between the ground electron subband of the EQW and the ground hole subband of the HQW.

22. The device of claim 1, wherein said selected layout of the layers defines the plurality of substantially equidistant neighboring energy subbands in at least one of the quantum well selected from the EQW and HQW, thereby causing said resonance condition of the multiple radiative transitions between a few of the substantially equidistant neighboring energy subbands of the respective quantum well.

23. The device of claim 1, wherein said substantially equidistant neighboring energy subbands include neighboring energy subbands within each of the EQW and HQW, and neighboring the ground energy electron subband of the EQW and the ground hole subband of the HQW.

24. The device of claim 19, wherein the predetermined inhomogeneous potential profile of at least one quantum well selected from the EQW and HQW is substantially semi-parabolic, thereby providing substantial equidistance in between a few of the neighboring energy subbands from the neighboring energy subbands in the respective quantum well and the neighboring ground electron subband of the EQW and ground hole subband of the HQW for causing the resonance condition of the multiple radiative transitions.

25. The device of claim 1, wherein the predetermined potential profile of at least one quantum well selected from the EQW and HQW is substantially step-like, while a few of the neighboring energy subbands in this quantum well and the neighboring ground electron subband of the EQW and ground hole subband of the HQW are substantially equidistant for causing the resonance condition of the multiple radiative transitions.

26. The device of claim 1, wherein the predetermined potential profiles of one of the EQW and HQW is substantially semi-parabolic and the predetermined potential profiles of the other of said EQW and HQW is step-like.

27. The device of claim 19, wherein said selected layout of the layers of the heterostructure defines the dispersion of the energy subbands such that excited subbands of the EQW define a nearly parabolic band-structure, and the ground electron subband of the EQW and ground hole subband of the HQW define a W-like dispersion.

28. The device of claim 20, wherein said arrangement of subbands provides the resonance condition for said neighboring subbands of the EQW within the entire range of variation of a wave-vector.

29. The device of claim 28, wherein the arrangement of subbands defines a majority of said neighboring subbands of the EQW being parallel in a subband dispersion plot.

30. The device of claim 28, wherein the multiple resonant transitions include the radiative transition between the ground electron subband of the EQW and the ground hole subband of the HQW.

31. The device of claim 21 wherein said selected layout provides for the radiative transition between the ground electron subband of the EQW and the ground hole subband of the HQW either at a zero value of a wave-vector for parabolic-like dispersion of said ground subbands or at non-zero value of an electron wave-vector for W-like dispersion of said ground subbands.

32. The device of claim 31 wherein said selected layout provides the resonant arrangement of the subbands for the radiative transition between at least one of the following: (i) the ground electron subband of the EQW and the ground hole subband of the HQW at a certain non-zero magnitude of the in plane wave-vector and (ii) the ground hole subband of the HQW and its neighboring hole subband at a certain non-zero magnitude of the in plane wave-vector providing that an energy gap corresponding to these transitions is minimal.

33. A semiconductor device operable in THz spectral range, the device comprising a heterostructure including at least first and second semiconductor layers and an electrodes' arrangement providing electrical contacts to the heterostructure to apply a bias field across the heterostructure, wherein
the first and second layers are made of materials providing certain initial overlap between the valence band of the material of the second layer and the conduction band of the material of the first layer,
the heterostructure has a selected layout of the layers providing a quantum mechanical coupling between an electron quantum well (EQW) in the first layer and a hole quantum well (HQW) in the second layer, where potential profiles of the EQW and HQW are selected to define an arrangement of energy subbands of a predetermined dispersion in at least one of the conduction band of the first layer and the valence band of the second layer to define a desired effective overlap between the energy subbands, the arrangement of energy subbands creating a condition of the multiple resonant radiative transitions of non-equilibrium carriers substantially of the same frequency of the THz spectral range between at least some of the following: the neighboring energy subbands of the EQW, the neighboring energy subbands of the HQW, and the ground energy electron subband of the EQW and the ground energy hole subband HQW.

34. The device of claim 1, wherein said THz spectral range includes a spectral range from 0.1 through 20 THz.

35. The device of claim 1, wherein the frequency of the radiative transitions is lower than a frequency of optical phonons.

36. A semiconductor device operable in a THz spectral range, the device comprising a heterostructure configured to generate the THz spectral range radiation in response to an external bias field applied across it, the heterostructure comprising at least first and second semiconductor layers made of materials providing a certain initial overlap between the valence band of the second layer material and the conduction band of the first layer material, the heterostructure having a selected layout of the layers providing a quantum mechanical coupling between an electron quantum well (EQW) in the first layer and a hole quantum well (HQW) in the second layer, and providing a predetermined potential profile of at least one of the quantum wells defined by an arrangement of a ground electron energy subband in the EQW and a hole energy subband in the HQW, thereby defining a desired effective overlap between the energy subbands of said conduction and valence bands and creating a condition of radiative transitions of the THz spectral range between said ground subbands.

37. The device of claim 36, wherein said selected layout provides for the radiative transition between the ground electron subband of the EQW and the ground hole subband of the HQW either at a zero value of a wave-vector for parabolic-like dispersion of said ground subbands or at non-zero value of an electron wave-vector for W-like dispersion of said ground subbands.

* * * * *